United States Patent [19]

Takeyama et al.

[11] Patent Number: 5,022,960

[45] Date of Patent: Jun. 11, 1991

[54] METHOD OF MANUFACTURING CIRCUIT BOARD FOR MOUNTING ELECTRONIC COMPONENTS

[75] Inventors: Takeshi Takeyama; Mitsuhiro Kondo, both of Oogaki, Japan

[73] Assignee: Ibiden Co., Ltd., Japan

[21] Appl. No.: 460,004

[22] Filed: Jan. 2, 1990

[30] Foreign Application Priority Data

May 1, 1989 [JP] Japan .................................. 1-113425

[51] Int. Cl.⁵ .................... B44C 1/22; C23F 1/02; C03C 15/00; C03C 25/06
[52] U.S. Cl. .................................. 156/643; 156/630; 156/634; 156/656; 156/659.1; 156/902; 29/846; 29/852; 219/121.69
[58] Field of Search .............. 156/629, 630, 634, 643, 156/656, 659.1, 666, 902; 219/121.67, 121.68, 121.69, 121.85, 121.7, 121.71; 29/846, 852; 427/53.1, 97

[56] References Cited

U.S. PATENT DOCUMENTS

| | | | |
|---|---|---|---|
| 4,179,310 | 12/1979 | Compton et al. | 219/121.69 X |
| 4,544,442 | 10/1985 | Lassen | 219/121.71 X |
| 4,622,058 | 11/1986 | Leary-Renick et al. | 219/121.71 X |
| 4,789,770 | 12/1988 | Kasner et al. | 219/121.7 X |
| 4,894,115 | 1/1990 | Eichelberger et al. | 156/643 |

FOREIGN PATENT DOCUMENTS

| | | |
|---|---|---|
| 52-48972 | 4/1977 | Japan . |
| 60-41249 | 3/1985 | Japan . |
| 60-194553 | 10/1985 | Japan . |
| 61-95792 | 5/1986 | Japan . |
| 63-114150 | 5/1988 | Japan . |
| 64-76747 | 3/1989 | Japan . |
| 8204173 | 11/1982 | PCT Int'l Appl. . |
| 1561620 | 2/1980 | United Kingdom . |

*Primary Examiner*—William A. Powell
*Attorney, Agent, or Firm*—Leydig, Voit & Mayer

[57] ABSTRACT

According to the present invention, a circuit board for mounting electronic components including a metal layer united with a substrate layer with a predetermined portion of the metal layer exposed is manufactured by disposing a mask between a substrate layer and a metal layer where the metal layer is to be exposed and uniting the substrate layer and the metal layer with the mask therebetween, projecting a laser beam onto the substrate layer at the periphery of the mask to cut away the substrate layer adjacent to the mask, and stripping off that part of the substrate layer which remains on the mask and the mask.

3 Claims, 8 Drawing Sheets

METHOD OF MANUFACTURING CIRCUIT BOARD FOR MOUNTING ELECTRONIC COMPONENTS

FIELD OF THE INVENTION

The present invention relates to a method of manufacturing a circuit board for mounting electronic components constructed by integrating a substrate layer with a metal layer. More particularly, it relates to a method of manufacturing a circuit board for mounting electronic components in which a predetermined part of the metal layer is exposed relative to the substrate layer by laser machining.

BACKGROUND OF THE INVENTION

As highly integrated electronic components of recent years cannot be used as they are to constitute various electronic equipment they must be used after being mounted on a circuit boards. To this end, circuit boards for mounting electronic components of various types have heretofore been developed and proposed.

A circuit board for mounting electronic components of the type wherein an electronic component is connected with terminals, such as leads, for externally connecting the component, is constructed as a circuit board for mounting electronic components, in such a way that a substrate layer formed of a resin or the like and exhibiting excellent insulating properties is united to a metal layer which serves as an electrically conducting layer, lead, heat transmission layer or the like, and conducting circuit pieces or the like are formed on the front surface or interior of the substrate layer.

Figure 1:
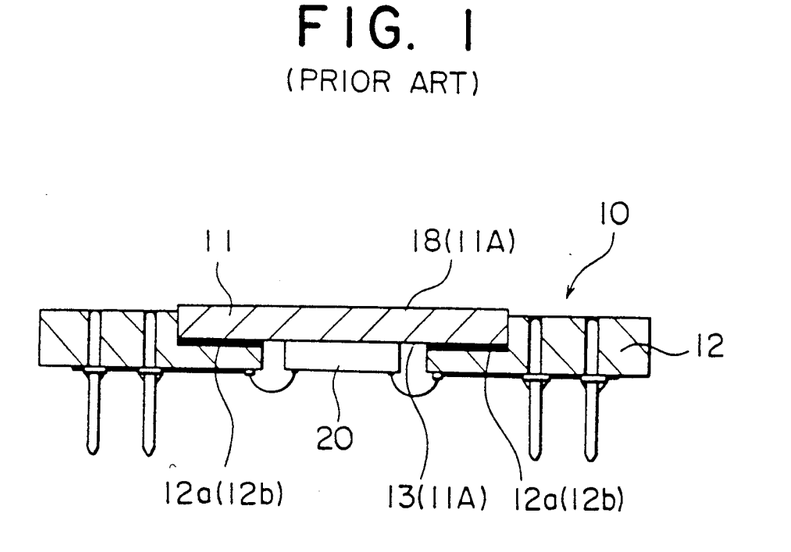
FIG. 1 is a sectional view of a circuit board for mounting electronic components formed by a manufacturing method in the prior art.
Figure 2A:
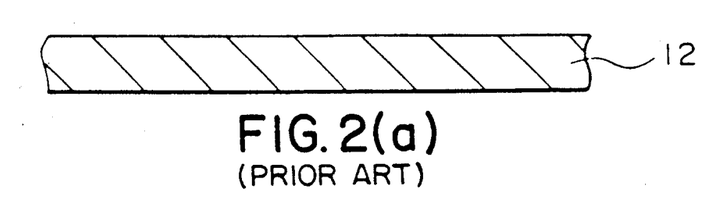
FIGS. 2(a) thru 2(d) are partially-enlarged sectional views each showing an intermediate process in the prior-art manufacture of the circuit board for mounting electronic components depicted in FIG. 1.
Figure 2B:
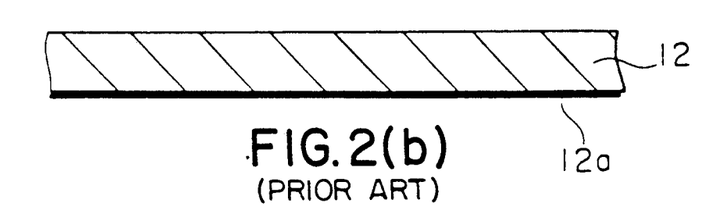
Figure 2C:
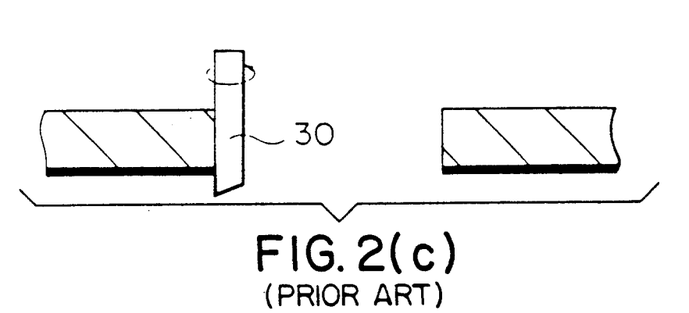
Figure 2D:
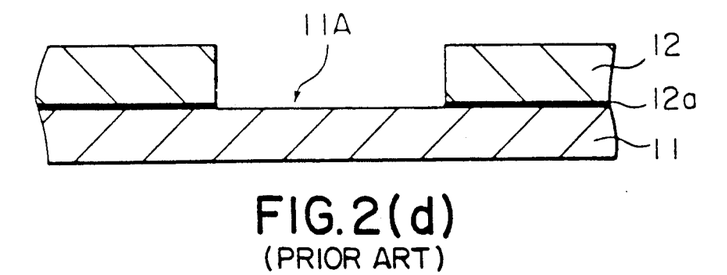

Regarding such a circuit board for mounting electronic components, it is common practice, as shown in FIG. 1 to expose a metal layer 11 relative to a substrate layer 12 and to form a recess 13 for mounting an electronic component 20 therein and a heat radiating portion 18 for dissipating heat produced from the electronic component 20.

The reason for forming the electronic component-mounting recess 13 and the heat radiating portion 18 with the metal layer 11 exposed relative to the substrate layer 12 as mentioned above is so that the heat produced when the electronic component 20 is energized can be transferred directly to the metal layer 11 of high thermal conductivity and further dissipated from the heat radiating portion 18 into the atmosphere, thereby enhancing the heat dissipation of the electronic component 20, or so that the circuit board for mounting electronic components with the metal layer 11 exposed relative to the substrate layer 12 with the electronic component 20 mounted thereon can be thinned down as a whole.

A prior-art method of forming the exposed metal part 11A of the circuit board for mounting electronic components as stated above has been usually performed as follows: As illustrated in FIGS. 2(a)-2(d) by way of example, an adhesive sheet 12a is bonded by thermocompression (tentatively bonded) to one surface of the substate layer 12 by means of a press or the like, The adhesive sheet includes a thermosetting resin composite which contains an epoxy resin, an unsaturated polyester resin, a polyimide resin or the like as its principal component. The sheet or film is brought into a semi-hardened state by heating it at a proper temperature for a proper period of time. Thereafter, those parts of the substrate layer 12 and the adhesive sheet 12a which correspond to the exposed metal part 11A are cut away using a drill 30. The cutting is effected by a router or the like, and is performed by hollowing out the substrate layer 12. The metal layer 11 is stuck to the substrate layer 12 thus machined and is bonded by thermocompression (finally bonded) thereto by means of a press or the like again, whereby the circuit board for mounting electronic components as needed is formed.

In order to employ the adhesive sheet 12a as stated above for the bonding between the substrate layer 12 and the metal layer 11, a low flowability is required of the resin of this adhesive sheet during the heating and compression thereof. This is to prevent the resin of the adhesive sheet 12a from flowing out and covering the part of the surface of the metal layer 11 that is the exposed part 11A when the substrate layer 12 and the metal layer 11 are bonded by thermocompression (finally bonded) by means of a press or the like.

An adhesive sheet 12a having such low flowability is ordinary endowed with flexibility by adding a rubber-like component to the thermosetting resin composite, providing a adhesiveness as well as low flowability. As a result of the addition of the rubber-like component, however, this type of adhesive sheet has such disadvantages as degraded resistance to heat moisture chemicals, etc.

Accordingly, the circuit board for mounting electronic components 10, which is formed with the exposed metal part 11A by bonding the substrate layer 12 and the metal layer 11 with the adhesive sheet 12a of low flowability as stated above, cannot attain satisfactory reliability in heat resistance, resistance to moisture, resistance to chemicals, etc.

Figure 3A:
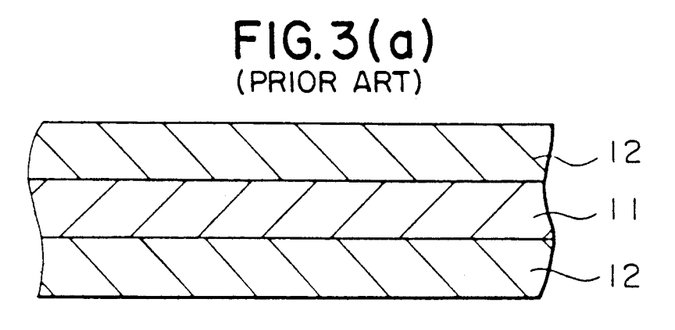
FIGS. 3(a) and 3(b) are partially-enlarged sectional views each showing intermediate process in the manufacture of a circuit board for mounting electronic components formed by another manufacturing method in the prior art.
Figure 3B:
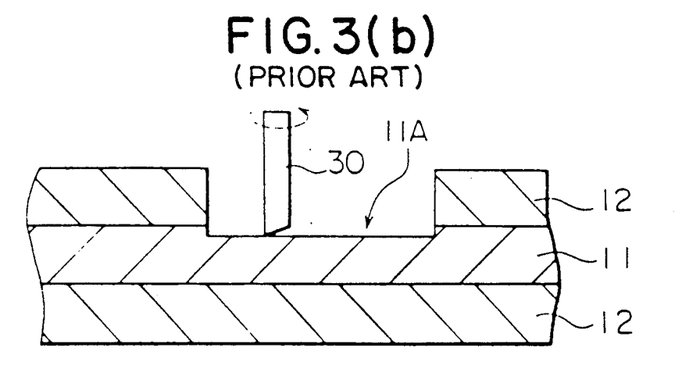

Another prior-art method has been as follows: As illustrated in FIGS. 3(a)-3(b) by way of example, layers of so-called "prepreg" 12b are stacked on the metal layer 11, the prepreg being prepared in such a way that glass cloth or the like is impregnated with a thermosetting resin and that the glass cloth is brought into a semi-hardened state by heating it at a proper temperature for a proper period of time. The prepreg layers are bonded by thermocompression to the metal layer 11 by means of a press or the like, thereby to form the substrate layers 12. Thereafter, the part of the substrate layer 12 corresponding to the area to become the exposed metal part 11A is subjected to so-called "Zaguri Working" [end milling]in which the part is cut away by moving the fore end of a drill 30, whereby the exposed metal part 11A is formed.

In the formation of the exposed metal part 11A by such "Zaguri Working" [end milling], it is difficult to cut away only the part of the substrate layer 12 corresponding to the exposed part 11A. In general, therefore, the underlying metal layer 11 is simultaneously subjected to cutting in order to reliably remove the substrate layer 12.

In the above formation of the exposed metal part 11A by "Zaguri Working" [end milling], the drill 30 is moved over all of the part to be exposed 11A, not over only the peripheral edge thereof. Therefore, long machining times have been required. Further, in order to reliably remove the part of the substrate layer 12 corresponding to the exposed part 11A, some of the metal layer 11 underlying the part must also be cut away. It has accordingly been impossible to form the exposed part 11A without any flaw in the metal layer 11. Moreover, since the whole area of the exposed part 11A and also the metal layer 11 must be cut away by the drill 30 in this manner, it is easy for the drill 30 to do some damage.

In addition, as a machining method of forming a hole in the substrate layer 12 of the circuit board for mounting electronic components 10, there has been proposed a "Method of Manufacturing a Printed-Wiring Circuit Board", employing a laser beam for machining as disclosed in Japanese published Patent Application 61-95792. That application states:

In a method of forming a hole by the use of a laser beam in a part of a printed-wiring circuit board from which a metal foil has been removed; a method of manufacturing a printed-wiring circuit board characterized in that said hole is formed by the laser beam whose lasing wavelength lies in a region of wavelengths to be reflected by said metal foil and which has a light projection area covering, at least, said part with said metal foil removed therefrom.

This method is a very excellent technique for forming small holes. In order to remove the part of the substrate layer 12 having a comparatively large area and to expose the metal layer 11, however, the substrate layer 12 corresponding to the entire exposed part 11A must be vaporized by the laser beam, and this takes a considerable period of time and necessitates prolonged operation of a laser machining apparatus which is expensive, so that this method is unsuitable as a technique for manufacturing a circuit board for mounting electronic components.

The inventors therefore made various studies on easy ways to expose metal part 11A of a comparatively large area in a substrate layer 12 of the circuit board for mounting electronic components 10 while the machining of the substrate layer 12 with the laser beam to complete the present invention.

The present invention has been made on the basis of the above circumstances, and a problem to be solved by the invention is the difficulty of the prior-art technique in exposing a metal part 11A with a comparatively large area.

SUMMARY OF THE INVENTION

An object of the present invention is to provide a method according to which, even when the machining of a laser beam is partial, an exposed metal part 11A in an electronic component-mounting circuit board 10 can be formed reliably and in a short time over a comparatively large area, and a circuit board for mounting electronic components 10 of high reliability can be manufactured.

In a method of manufacturing a circuit board for mounting electronic components which is constructed by uniting a substrate layer with a metal layer and exposing a predetermined part of the metal layer through the substrate layer according to the invention a mask is placed on a part of a metal layer be exposed part through a substrate layer and thereafter the substrate layer is united with the metal layer a laser beam is projected onto the substrate layer at the periphery of the mask from a side of said substrate layer 12 to a side of said metal to cut away the substrate layer 12 overlying the mask and the part of the substrate layer 12 which remains on the mask 16, together with said mask 16.

DETAILED DESCRIPTION OF PREFERRED EMBODIMENTS

Figure 4A:
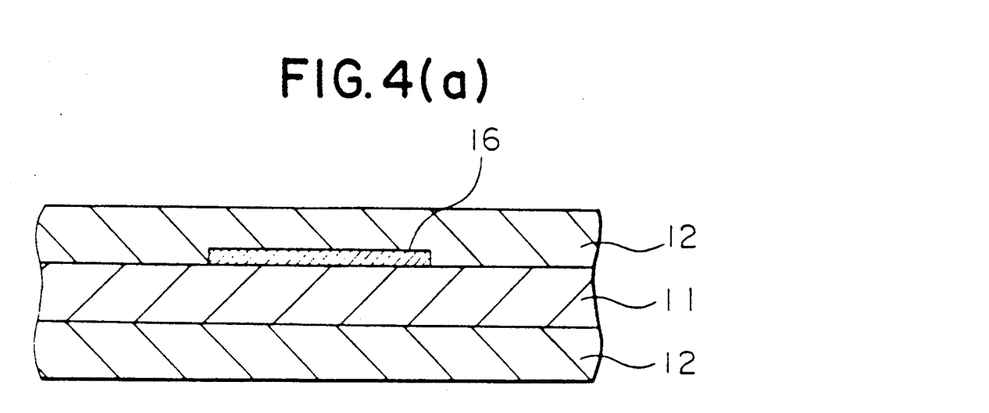
FIGS. 4(a) thru 4(c) are partially-enlarged sectional views each showing an intermediate process in the manufacture of a circuit board for mounting electronic components formed by a manufacturing method according to the present invention.

As the method of the present shown in FIG. 4(a), a mask 16 is first arranged between a substrate layer 12 and the part of a metal layer 11 that will be exposed part 11A in order to keep the substrate layer and the metal layer from being united, but with the substrate layer 12 and the other part of the metal layer 11 uniting.

Any type of mask 16 may be used insofar as it does not deform even when subjected to the shocks of heat, pressure, etc. in the series of steps for manufacturing the circuit board for mounting electronic components 10, such as the step of uniting the metal layer 11 with the substrate layer 12, and as it can be finally stripped off from the metal layer 11 by any expedient. Mentioned as examples are resin films of comparatively high thermal resistance, and metal foils.

In addition, the metal layer 11 and the substrate layer 12 are uniting in such a way that, while a thermosetting resin before being fully hardened is held in close contact with the metal layer 11, it is heated at a proper temperature for a proper period of time, so as to bond the metal layer 11 and the substrate layer 12. As the uniting method here, there is mentioned, e.g., a method in which a layer of prepreg is stacked on the metal layer 11, bonded by thermocompression with a press or the like, thereby forming the prepreg layer into the substrate layer 12, a method in which an adhesive sheet in a semi-hardened state is arranged between the metal layer 11 and the substrate layer 12, bonded by thermocompression with a press or the like, thereby uniting the substrate layer 12, or a method of so-called "injection molding" in which the thermosetting resin is injected into a metal mold holding the metal layer 11 therein, and it is thermally set into the substrate layers 12.

Figure 4B:
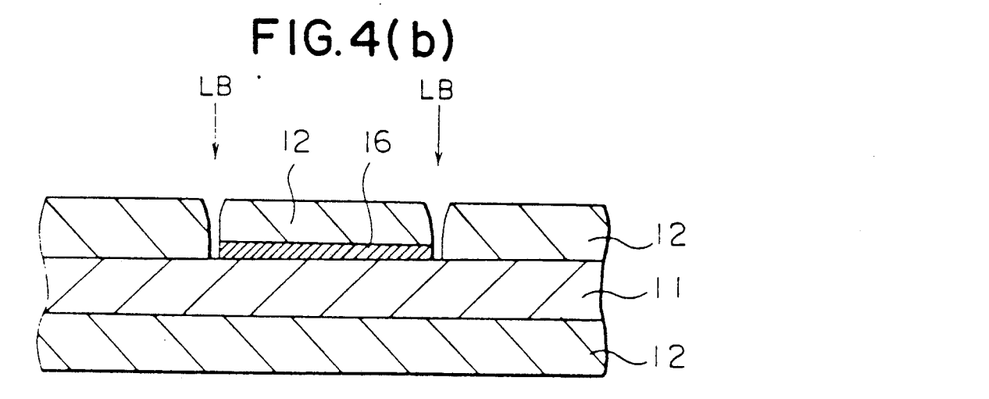

Subsequently, as shown in FIG. 4(b), a laser beam LB is projected from outside the substrate layer 12 as described above, onto that part of the substrate layer 12 surrounding the mask 16.

The laser beam LB for use here needs to favorably cut the substrate layer 12 without flawing the metal layer 11. Therefore, it should desirably have a wavelength which is highly reflected by metals. In this regard, if a $CO_2$ laser having a lasing wavelength of 10.6 $\mu$m is employed, the substrate layer 12 can be cut without inflicting any damage to the metal layer 11.

In this manner, that part of the substrate layer 12 surrounding the mask 16 is cut by the laser beam, whereby a groove which reliably separates the part of the substrate layer 12 overlying the mask 16 and the other part of the substrate layer 12 is formed around the mask 16 as shown in FIG. 4(b).

When such a groove surrounding the mask 16 has been formed, the part of the substrate layer 12 overlying the mask 16 is completely separated from the other part of the substrate layer 12. Moreover, the mask 16 and the metal layer 11 are not bonded as stated before, so that the mask 16 can be readily stripped off.

Figure 4C:
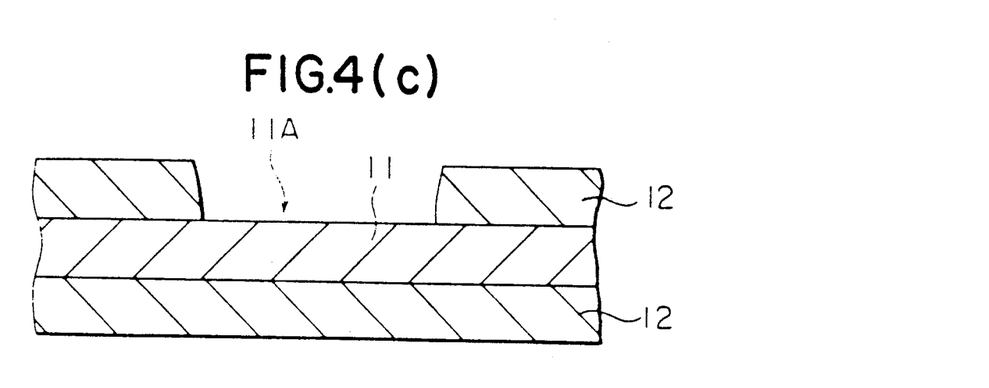

After the above steps, the part of the substrate layer 12 overlying the mask 16 is stripped off from the metal layer 11 together with this mask to complete the exposed metal part 11A as shown in FIG. 4(c).

When the exposed metal part 11A of the electronic component-mounting circuit board 10 is formed by such a method, the following advantages are attained.

At the part to become the exposed metal part 11A, the uniting between the substrate layer 12 and the metal layer 11 is hindered by the mask 16. By way of example, even when an adhesive sheet the resin of which exhibits a high flowability during the thermocompression is adopted as the adhesive sheet 12a for bonding the substrate layer 12 and the metal layer 11, it is possible owing to the intervention of the mask 16 to prevent the resin of the adhesive sheet 12a from flowing out onto the surface of the exposed metal part 11A. Therefore, an adhesive sheet 12a that has, such properties as excellent heat, moisture and chemical resistance, can be adopted.

Further, especially when a $CO_2$ laser having a lasing wavelength of 10.6 $\mu$m is adopted, a laser beam high reflected by metals can be obtained, as well as one that favorably cuts resin, glass cloth, etc. As a result, when the laser beam is projected on the substrate layer 12 side, only the substrate layer 12 is selectively cut without damaging the metal layer 11. Accordingly, even in a case where the thickness of the substrate layer 12 fluctuates to some extent, the cutting with the laser beam is stopped at the upper surface of the metal layer 11 without fail, and hence, the depth of the cutting is controlled easily and precisely.

In addition, machining with the laser beam may be performed for that part of the substrate layer 12 on the metal layer 11 which surrounds the mask 16, and no operation at all is required for the part of the substrate layer 12 overlying the mask 16. Therefore, the machining operation is completed in a very short time.

Moreover, since, the machining with the laser beam is non-contact machining, tool damage during the machining operation can be completely ignored, and hence, stable machining can be effected.

Now, the manufacturing method according to the present invention will be described in detail in conjunction with embodiments illustrated in the drawings.

EMBODIMENT 1

Embodiment 1 of the present invention is illustrated in FIG. 5, FIG. 6 and FIG. 7(a), 7(b) and 7(c).

Figure 5:
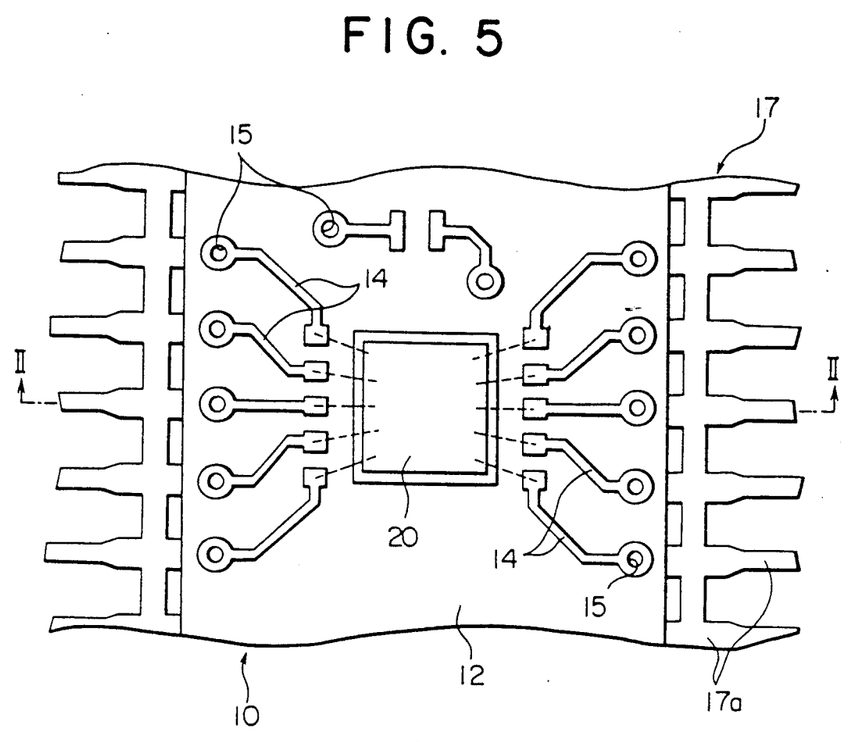
FIG. 5 is a partially-enlarged plan view showing an example of a circuit board for mounting electronic components formed by the manufacturing method according to the present invention.
Figure 6:
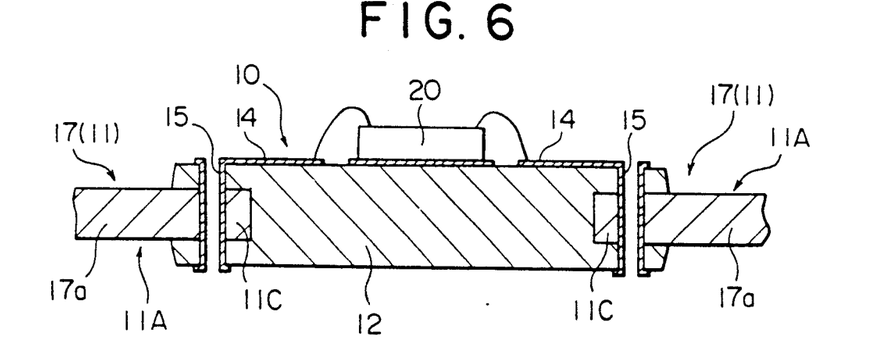
FIG. 6 is a sectional view taken along line II—II in FIG. 5.

Shown in FIGS. 5 and 6 is a circuit board for mounting electronic components 10 in which a plurality of outer leads 17a are unitary with internal connection portions 11C inside said outer leads, and said internal connection portions 11C are unitary with a substrate layer 12 on both sides of said internal connection portions, whereby the individual outer leads 17a protrude from said substrate layer 12, and said outer leads 17a and conductors 14 formed on at least one side of the substrate are electrically connected.

The circuit board for mounting electronic components 10 is of the type wherein the electrical connections between an electronic component 20 and the outer leads 17a are effected through the conductors 14 formed on the substrate layer 12. In particular, a metal layer 11 is adopted in which the outer leads 17a and the internal connection portions 11C are unitarily formed. In the circuit board for mounting electronic components 10, accordingly, the substrate layer 12 is unitarily provided on both sides of the internal connection portions 11C constituting the metal layer 11, with the outer leads 17a protruding outwards from the substrate layer 12. Herein, the circuit board for mounting electronic components 10 is characterized in that the conductors 14 on the substrate layer 12 and the outer leads 17a are electrically connected by through holes 15 which penetrate the internal connection portions 11C.

Figure 7A:
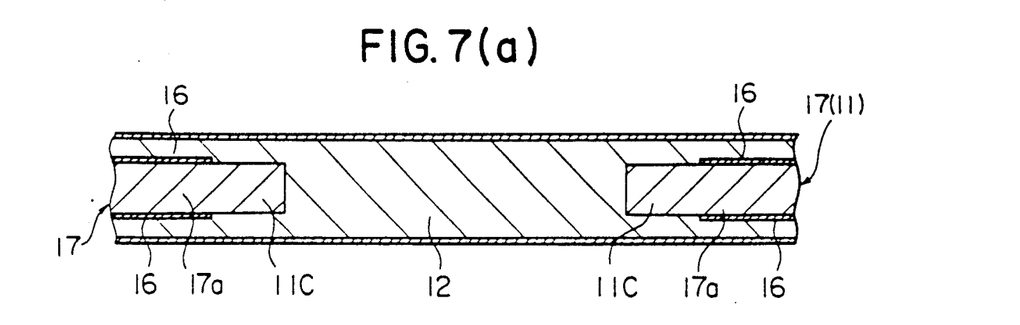
FIGS. 7(a) thru 7(c) are partially-enlarged sectional views each showing an intermediate process in the manufacture of the circuit board for mounting electronic components depicted in FIGS. 5 and 6.

A method of manufacturing the circuit board for mounting electronic components 10 will be described below with reference to FIGS. 7(a)-7(c).

(1) A lead frame 17 (which corresponds to the metal layer 11) is formed by etching a lead frame material, and masks 16 are arranged covering both surfaces of each part of the lead frame 17 that is to become an outer lead 17a. Further, a prepreg layer and a copper foil are stacked outside each of the masks 16 in the order mentioned, and the stacked constituents are subjected to thermocompression by a press, thereby to be brought into a unitary lamination. Thus, there is formed a circuit board in a shape in which, as shown in FIG. 7(a), the lead frame 17 is buried in the substrate layer 12 in such a manner that the parts to become the outer leads 17a are kept by the masks 16 from being unitarily laminated with the substrate layer 12.

In an example of Embodiment 1, the lead frame material used was a copper alloy sheet which was 0.25 mm thick, and the prepreg used was a so-called "glass triazine prepreg" in which glass cloth was impregnated with a bismaleimide triazine resin that was then brought into a semi-hardened state.

In addition, the mask 16 used was a polyphenylene sulfide film, namely, a so-called "PPS" film which was 50 $\mu$m thick.

(2) Subsequently, the through holes 15 for electrically connecting the outer leads 17a with the conductors 14 to be formed on the top surface of the substrate layer 12 were opened by a drill, and the inner walls thereof plated with copper.

Figure 7B:
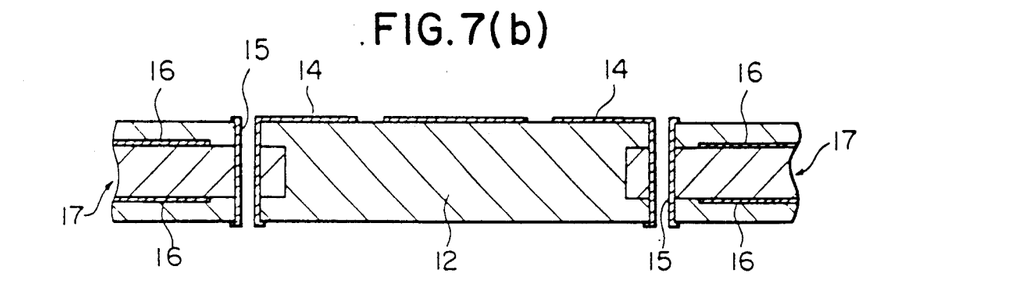

Thereafter, the conductors 14 were formed on the top surface of the substrate layer 12 by etching the copper foils to form a circuit board as shown in FIG. 7(b).

(3) Subsequently, those parts of the substrate layer 12 on the metal layer 11 which surround the masks 16 are cut using a $CO_2$ laser, whereby grooves which reliably separate the parts of the substrate layer 12 overlying the masks 16 from the other part of the substrate layer 12 are formed around the respective masks 16. Then, since the respective masks 16 and the corresponding outer leads 17a are not bonded, the mask 16 and the parts of the substrate layer 12 overlying the outer leads 17a are easily separated from the other parts.

Figure 7C:
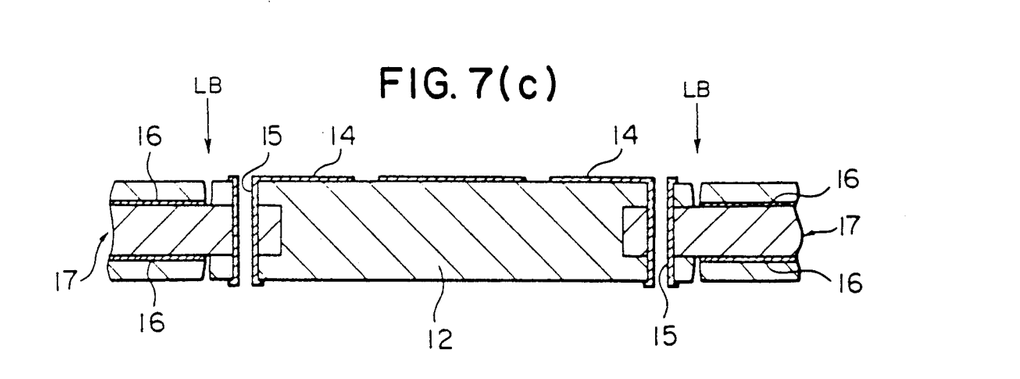

When similar laser machining is also performed from the bottom surface of the substrate layer 12, a circuit board as shown in FIG. 7(c) is formed.

(4) Lastly, the masks 16 and the parts of the substrate layer 12 overlying and underlying the outer leads 17a are stripped off. Then, the circuit board for mounting electronic components 10 as shown in FIG. 6 is formed.

In the circuit board for mounting electronic components 10 manufactured by such a method, the outer leads 17a are not damaged by the beam of the laser, and hence, physical performance of the outer leads 17a, such as bending strength and pulling-out strength, is not degraded.

EMBODIMENT 2

Next, Embodiment 2 of the present invention will be described in accordance with FIG. 8 and FIGS. 9(a)-9(c).

Figure 8:
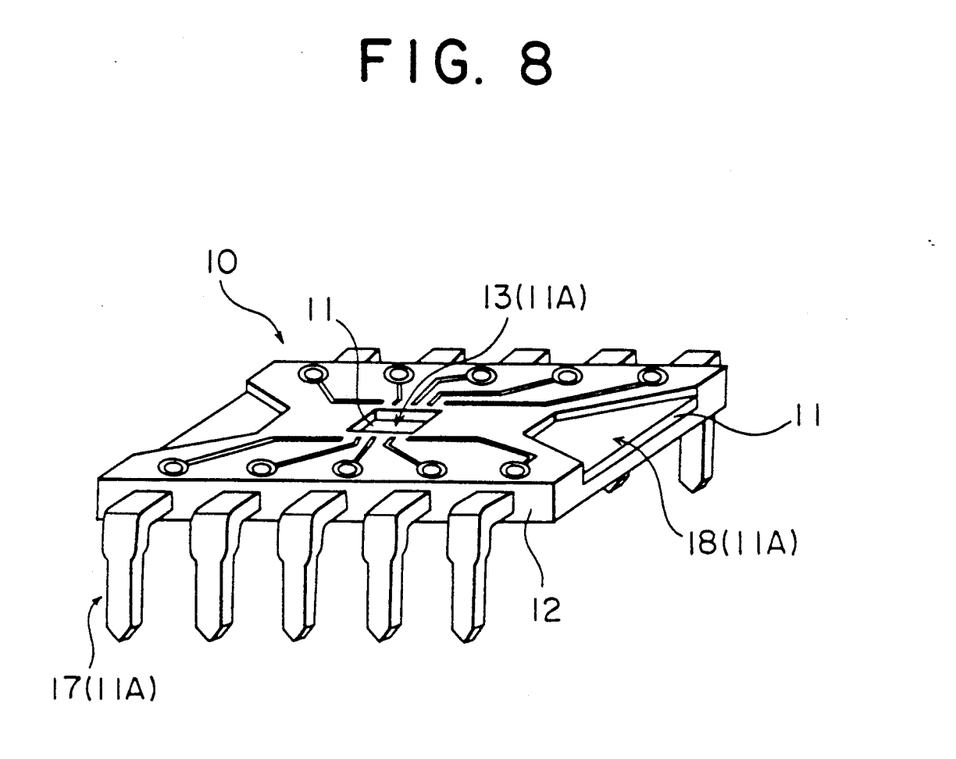
FIG. 8 is a perspective view showing another example of a circuit board for mounting electronic components formed by the manufacturing method according to the present invention.

A circuit board for mounting electronic components 10 shown in FIG. 8 has a recess 13 for mounting an electronic component 20 therein, and heat radiating portions 18 for dissipating heat produced from the electronic component 20, into the atmosphere. A method of manufacturing the circuit board for mounting electronic components 10 will be described below with reference to FIGS. 9(a)-9(c).

Figure 9A:
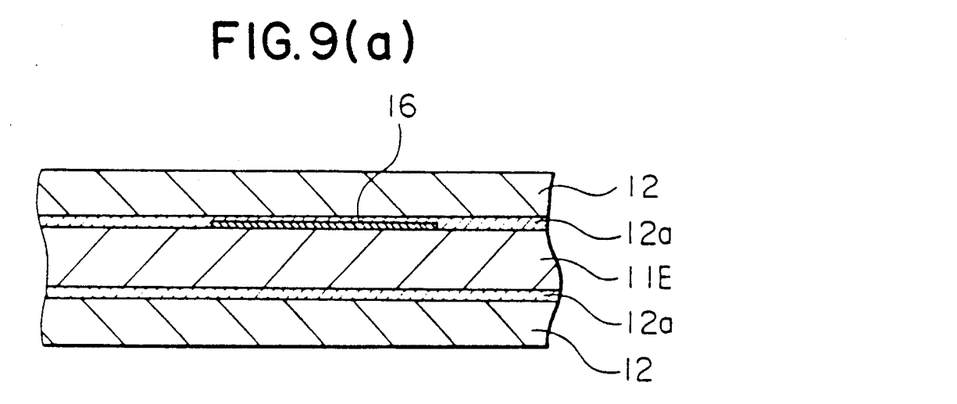
FIGS. 9(a) thru 9(c) are partially-enlarged sectional views each showing an intermediate process in the manufacture of the circuit board for mounting electronic components depicted in FIG. 8.

(1) A mask 16 is arranged on a portion of an 1.0 mm thick aluminum plate 11B which is to become a exposed metal part 11A. An adhesive sheet 12a and a substrate layer 12 are stacked on each of the sides of the aluminum plate 11B, and the stacked constituents are subjected to thermocompression by a press, thereby to bring the aluminum plate 11B and the substrate layers 12 into a unitary lamination. Then, a circuit board as shown in FIG. 9(a) is formed.

In an example of Embodiment 2, the mask 16 used was a 25 $\mu$m thick aluminum foil, and the adhesive sheet 12a used was a semi-hardened film which contained an epoxy resin as its principal component. In addition, the substrate layer 12 used was a glass epoxy prepreg which was fully hardened.

Figure 9B:
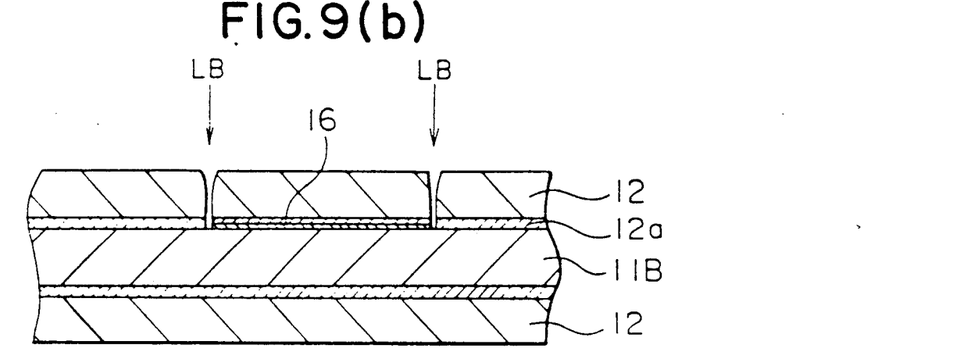

(2) Subsequently, that part of the substrate layer 12 overlying the metal layer 11 (aluminum plate 11B) which surrounds the mask 16 is cut using a $CO_2$ laser to form a circuit board as shown in FIG. 9(b).

Figure 9C:
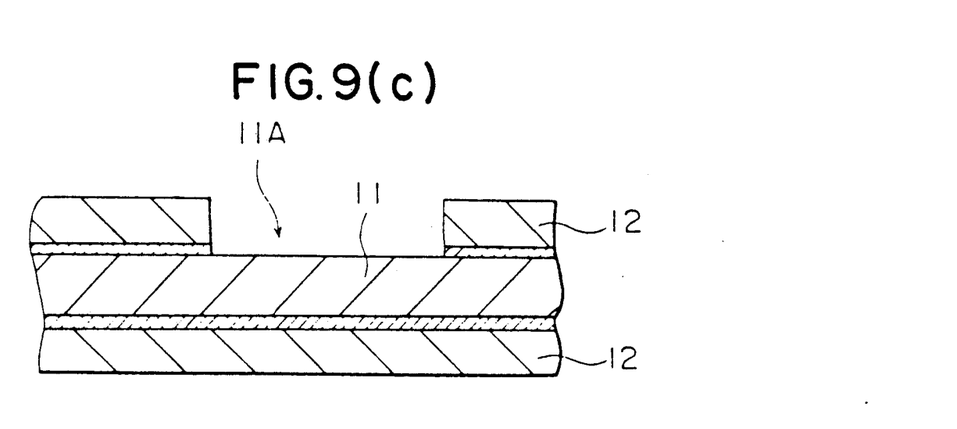

(3) Lastly, the mask 16 and the part of the substrate layer 12 overlying the exposed metal part 11A are stripped off to form the electronic component-mounting recess 13 or the heat radiating portion 18 in which the metal layer 11 is exposed as shown in FIG. 9(c).

The heat radiating portions 18 can, of course, be formed on both the surfaces of the circuit board for mounting electronic components 10 for a higher degree of heat radiation.

As described above in detail, the present invention consists, as exemplified by the foregoing embodiments, in:

A method of manufacturing a circuit board for mounting electronic components 10 which is constructed by uniting a substrate layer 12 with a metal layer 11 and exposing predetermined part of the metal layer 11 through the substrate layer 12 comprising:

(1) placing a mask 16 between the substrate layer 12 and the part of said metal layer 11 to be exposed part 11A, and thereafter unitizing the substrate layer 12 with the metal layer 11;

(2) projecting a laser beam onto that part of the substrate layer 12 at the periphery of the mask 16 side of said substrate, layer 12 to a side of said metal to the cut away substrate layer 12 surrounding the mask 16; and (3) stripping off the substrate layer 12 which remains the mask 16, together with the mask 16.

Thus, even when there is only partial cutting with the laser beam, the formation of the exposed metal part 11A in the circuit board for mounting electronic components 10 can be carried out reliably and in a short time over a comparatively large area without damaging the metal layer 11.

More concretely, with the manufacturing method according to the present invention, besides the fact that the exposed metal part 11A comprising the circuit board for mounting electronic components 10 can be formed reliably and in a short time, tool damage during the machining operation can be completely ignored due to the non-contact machining by the laser beam.

In addition, the mask 16 is arranged on the part to become the exposed metal part 11A, so that when the metal layer 11 and the substrate layer 12 are uniting the resin does not adhere to the surface of the part to become the exposed metal part 11A. It is therefore possible to adopt, for example, an adhesive sheet whose flowability during thermocompression is comparatively high. Accordingly, an adhesive sheet having superior performance, such as in heat, chemical and moisture resistance, can be employed, with the result that a circuit board for mounting electronic components 10 of high reliability can be obtained.

Further, as a laser beam has much better capabilities, in cutting resins than metals, the metal layer 11 is not damaged even when the substrate layer 12 has been fully cut. Therefore, the depth of the cutting can be reliably controlled, and the physical strength of the metal layer 11 is not degraded.

What is claimed is:

1. A method of manufacturing a circuit board for mounting electronic components including a metal layer exposed through part of a substrate layer comprising:
   disposing a mask on a part of a metal layer that will be exposed;
   placing a substrate layer covering said mask on the metal layer;
   uniting said substrate layer with said metal layer with said mask therebetween;
   projecting a laser beam onto said substrate layer adjacent to said mask to cut away said substrate layer adjacent to said mask; and
   stripping off that part of said substrate layer disposed on said mask and said mask.

2. A method of manufacturing a circuit board for mounting electronic components as defined in claim 1 wherein said substrate layer is a glass resin prepreg, said metal layer is a copper alloy sheet, and said mask is a resin film including projecting a laser beam emitted from a CO$_2$ laser.

3. A method of manufacturing a circuit board for mounting electronic components as defined in claim 1 wherein said substrate layer is a resin sheet, said metal layer is an aluminum plate, and said mask is a metal foil including projecting a laser beam emitted from a CO$_2$ laser.

* * * * *